United States Patent
Kim et al.

(10) Patent No.: US 9,384,105 B2
(45) Date of Patent: Jul. 5, 2016

(54) METHOD OF DETECTING FAULTS OF OPERATION ALGORITHMS IN A WIRE BONDING MACHINE AND APPARATUS FOR PERFORMING THE SAME

(71) Applicant: Samsung Electronics Co., Ltd., Suwon-si (KR)

(72) Inventors: Min Kim, Cheonan-si (KR); Yean-Sang You, Asan-si (KR); Won-Gil Han, Cheongju-si (KR); Ho-Am Kim, Asan-si (KR); Byong-Joo Kim, Asan-si (KR); Do-Hoon Lee, Cheonan-si (KR)

(73) Assignee: Samsung Electronics Co., Ltd. (KR)

( * ) Notice: Subject to any disclaimer, the term of this patent is extended or adjusted under 35 U.S.C. 154(b) by 156 days.

(21) Appl. No.: 14/185,447

(22) Filed: Feb. 20, 2014

(65) Prior Publication Data
US 2014/0359372 A1    Dec. 4, 2014

(30) Foreign Application Priority Data
Jun. 3, 2013  (KR) .......................... 10-2013-0063471

(51) Int. Cl.
| G06F 11/00 | (2006.01) |
| G06F 11/26 | (2006.01) |
| G01R 31/04 | (2006.01) |
| G01R 31/02 | (2006.01) |

(52) U.S. Cl.
CPC ................ *G06F 11/26* (2013.01); *G01R 31/04* (2013.01); *G01R 31/025* (2013.01); *H01L 2224/48091* (2013.01)

(58) Field of Classification Search
CPC ....... G06F 11/25; G06F 11/26; G06F 11/263; G06F 11/1608; G05B 23/0218; H01L 2224/48091; H01L 2924/00014; G01R 31/04; G01R 31/025
USPC ........ 714/38.1, 25, 27, 32, 33, 37, 39, 40, 41, 714/45, 47.1, 47.3
See application file for complete search history.

(56) References Cited

U.S. PATENT DOCUMENTS

| 5,909,034 | A  | * | 6/1999 | Soldavini ............ H01L 23/4824 257/48 |
| 6,851,100 | B1 |   | 2/2005 | You et al. |
| 7,004,373 | B1 | * | 2/2006 | Miller .................. B23K 20/004 228/103 |
| 7,029,929 | B1 |   | 4/2006 | Lu et al. |
| 7,745,932 | B2 | * | 6/2010 | Ko .................... H01L 23/49575 257/735 |
| 2002/0130158 | A1 | * | 9/2002 | Boller .................. B23K 20/004 228/103 |
| 2003/0124834 | A1 |   | 7/2003 | Tseng et al. |
| 2014/0103096 | A1 | * | 4/2014 | Zhang ..................... H01L 24/85 228/104 |

FOREIGN PATENT DOCUMENTS

| JP | 9-113566       | 5/1997  |
| JP | 2000-208551    | 7/2000  |
| JP | 2000-223526    | 8/2000  |
| KR | 10-2000-0018709| 4/2000  |
| KR | 10-2000-0019782| 4/2000  |
| KR | 10-2003-0073363| 9/2003  |
| KR | 10-2006-0012466| 2/2006  |
| KR | 10-2009-0088638| 8/2009  |
| KR | 10-2011-0118928| 11/2011 |

* cited by examiner

*Primary Examiner* — Joseph D Manoskey
(74) *Attorney, Agent, or Firm* — Onello & Mello LLP

(57) ABSTRACT

In a method of detecting faults of operation algorithms in a wire bonding machine, individual bond parameters with respect to each of the operation algorithms of the wire bonding machine can be set based on design data including information with respect to conductive wires connected between semiconductor chips of a semiconductor package. Actual conductive wires of an actual semiconductor package can be formed using the wire bonding machine into which the design data can be inputted. Actual data with respect to actual operation algorithms of the wire bonding machine, which can form the actual conductive wires, can be obtained. The actual data can be compared with the individual bond parameters to detect the faults of the operation algorithms of the wire bonding machine. Thus, forming an abnormal conductive wire by the wire bonding machine can be prevented beforehand.

20 Claims, 5 Drawing Sheets

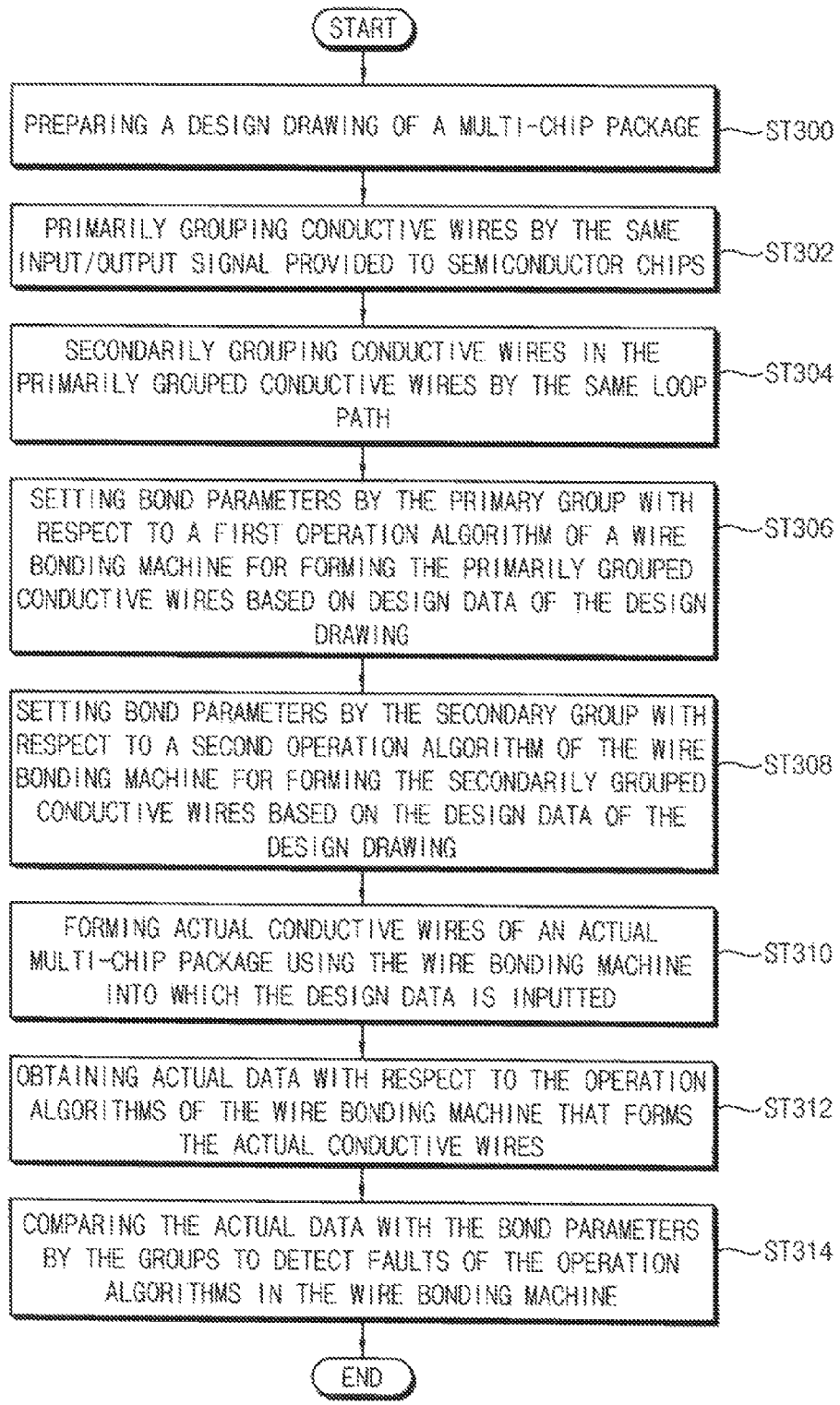

METHOD OF DETECTING FAULTS OF OPERATION ALGORITHMS IN A WIRE BONDING MACHINE AND APPARATUS FOR PERFORMING THE SAME

CROSS-RELATED APPLICATION

This application claims priority under 35 USC §119 to Korean Patent Application No. 2013-63471, filed on Jun. 3, 2013 in the Korean Intellectual Property Office (KIPO), the contents of which are herein incorporated by reference in their entirety.

FIELD

The present inventive concepts relate to a method of detecting faults of operation algorithms in a wire bonding machine and an apparatus for performing the same. More particularly, the inventive concepts relate to a method of detecting faults of operation algorithms in a wire bonding machine that can form conductive wires between semiconductor chips of a multi-chip package, and an apparatus for performing the method.

BACKGROUND

Generally, various semiconductor fabrication processes can be performed on a wafer to form a plurality of semiconductor chips. In order to form a semiconductor package, a plurality of the semiconductor chips can be mounted on a printed circuit board (PCB), and then a packaging process can be performed to form a semiconductor package.

In order to increase storage capacity of the semiconductor package, a multi-chip package having sequentially stacked semiconductor chips cancan be formed. The stacked semiconductor chips can be electrically connected with each other using conductive wires. When the conductive wires can have defects caused by faults of a wire bonding machine, the semiconductor chips can be disconnected, or otherwise not properly connected. Thus, testing the conductive wires can be necessary.

The conductive wires of the multi-chip package can be classified into first conductive wires connected between adjacent upper and lower semiconductor chips, second conductive wires connected between an uppermost semiconductor chip and a package substrate, etc. The first conductive wires and the second conductive wires can have different electrical connecting functions. Therefore, it can be required to setting different operation algorithms in the wire bonding machine with respect to the first conductive wires and the second conductive wires.

According to related arts, the wire bonding machine in which a single operation algorithm can be set can form the conductive wires having different electrical connecting functions. For example, when the operation algorithm includes a current passing through the conductive wires, a wide single range can be set as an allowable range of the current, regardless of the different electrical connection functions.

Therefore, although an allowable current range of an abnormal conductive wire can be very low in view of the electrical connecting functions, the single operation algorithm of the wire bonding machine, which can form the abnormal conductive wire, can be determined to be normal due to the wide allowable current range. In a final test of the multi-chip package, the multi-chip package can be finally determined to be abnormal due to the abnormal conductive wire. As a result, a multi-chip package manufactured at a high cost may have to be discarded.

SUMMARY

In accordance with aspects of the inventive concept, there is provided a method of detecting faults of operation algorithms in a wire bonding machine. The method can prevent an abnormal conductive wire from being formed.

In accordance with other aspects of the invention, also provided is an apparatus for performing the above-mentioned method, which may take the form of an improved wire bonding system.

According to one aspect of the inventive concept, provided is a method of detecting faults of operation algorithms in a wire bonding machine. In the method of detecting the faults of the operation algorithms in the wire bonding machine, individual bond parameters with respect to each of the operation algorithms of the wire bonding machine can be set based on design data including information with respect to conductive wires connected between semiconductor chips of a semiconductor package. Actual conductive wires of an actual semiconductor package can be formed using the wire bonding machine into which the design data can be inputted, e.g., and electronically stored in the wire bonding machine. Actual data with respect to actual operation algorithms of the wire bonding machine, which can form the actual conductive wires, can be electronically obtained by the wire bonding machine. The actual data can be compared, by the wire bonding machine, with the individual bond parameters to detect the faults of the operation algorithms of the wire bonding machine.

In example embodiments, the method can further include grouping the conductive wires in the design data by substantially the same electrical connecting function.

In example embodiments, setting the individual bond parameters can include setting individual bond parameters by groups with respect to the operation algorithms of the wire bonding machine for forming each of the grouped conductive wires.

In example embodiments, grouping the conductive wires by the same electrical connecting function can include primarily grouping the conductive wires connected between the semiconductor chips by substantially the same input/output signals provided to the semiconductor chips.

In example embodiments, grouping the conductive wires by the same electrical connecting function can further include secondarily grouping the primarily grouped conductive wires by substantially the same loop path length.

In example embodiments, setting the individual bond parameters can include setting primarily setting individual bond parameters for primary groups with respect to primary operation algorithms of the wire bonding machine for forming the primarily grouped conductive wires, and secondarily setting individual bond parameters for second groups with respect to secondary operation algorithms of the wire bonding machine for forming the secondarily grouped conductive wires.

In example embodiments, the individual bond parameters can include one or more of a current, a power, a time, etc., used in the wire bonding machine for forming the conductive wires.

According to another aspect of the inventive concept, provided is an apparatus configured to detect faults of operation algorithms in a wire bonding machine. The apparatus can include a bond parameter-setting unit, a data-obtaining unit and a fault-detecting unit. The bond parameter-setting unit can set individual bond parameters with respect to each of the operation algorithms of the wire bonding machine based on inputted design data including information for forming conductive wires between semiconductor chips of a semiconductor package. The data-obtaining unit can be configured to obtain actual data with respect to actual operation algorithms of the wire bonding machine that can form actual conductive wires of an actual semiconductor package using the design data. The fault-detecting unit can be configured to compare the actual data with the individual bond parameters to detect the faults of the operation algorithms of the wire bonding machine.

In example embodiments, the apparatus can further include a grouping unit be configured to group the conductive wires in the design data by substantially the same electrical connecting function.

In example embodiments, the bond parameter-setting unit can be configured to set individual bond parameters for each grouping of conductive wires with respect to an operation algorithm of the wire bonding machine used to form each of the groupings of conductive wires.

In example embodiments, the grouping unit can include a first grouping member be configured to primarily group the conductive wires connected between the semiconductor chips by substantially the same input/output signals provided to the semiconductor chips.

In example embodiments, the grouping unit can further include a second grouping unit be configured to secondarily group the primarily grouped conductive wires by substantially the same loop path length.

In example embodiments, the bond parameter-setting unit can include a first setting member be configured to primarily set individual bond parameters for primary groups with respect to primary operation algorithms of the wire bonding machine used to form the primarily grouped conductive wires, and a second setting member be configured to secondarily set individual bond parameters for second groups with respect to secondary operation algorithms of the wire bonding machine used to form the secondarily grouped conductive wires.

In example embodiments, the bond parameters can comprise at least one of a current, a power and a time used in the wire bonding machine for forming the conductive wires.

In accordance with another aspect of the present invention, provided is a wire bonding system having fault detection. The system comprises a wire bonding apparatus configure to form and bond wires between one or more chips and a substrate in a semiconductor package according to an inputted design data, wherein the wire bonding apparatus can form different groups of wires in the same package according to different operation algorithms, each group of wires having at least one different bonding parameter; a bond parameter-setting unit configured to set individual bond parameters with respect to each of the operation algorithms; a data-obtaining unit configured to obtain actual data with respect to the operation algorithms of the wire bonding machine that form the actual conductive wires; and a fault-detecting unit configured to compare the actual data with the bond parameters to detect the faults of the operation algorithms in the wire bonding machine.

In example embodiments, the system can further comprise a grouping unit configured to group the conductive wires having substantially the same electrical connecting function based on the design data.

In example embodiments, the bond parameter-setting unit can be configured to set bond parameters for each grouping of conductive wires with respect to operation algorithms of the wire bonding machine used to form each groupings of conductive wires.

In example embodiments, the grouping unit can comprise a first grouping member configured to primarily group conductive wires connected between the semiconductor chips by substantially the same input/output signal provided to the semiconductor chips.

In example embodiments, the grouping unit can comprise a second grouping member configured to secondarily group conductive wires in the primarily grouped conductive wires by substantially the same loop path length.

In example embodiments, the bond parameter-setting unit can comprise a first setting member configured to set a first bond parameter for the primary group with respect to a first operation algorithm of the wire bonding machine used to form the primarily grouped conductive wires, and a second setting member configured to set a second bond parameter for the secondary group with respect to a second operation algorithm of the wire bonding machine used to form the secondarily grouped conductive wires. The bond parameters can comprise at least one of a current, a power and a time used in the wire bonding machine for forming the conductive wires.

According to various aspects of the inventive concept, faults of a wire bonding machine that is configured to form conductive wires having different electrical connecting functions can be accurately detected using the individual bond parameters by the conductive wires. Thus, forming an abnormal conductive wire by the wire bonding machine can be prevented beforehand. As a result, discarding semiconductor packages having faulty wire bonding can be generally avoided.

BRIEF DESCRIPTION OF THE DRAWINGS

The inventive concept will be more clearly understood from the following detailed description taken in conjunction with the accompanying drawings. FIGS. 1 to 5 represent non-limiting, example embodiments in accordance with the inventive concepts, as described herein.

FIG. 1 is a block diagram illustrating an example embodiment of an apparatus configured to detect faults in an operation algorithms of a wire bonding machine, in accordance with aspects of the inventive concept;

FIG. 2 is a flow chart illustrating an embodiment of a method of detecting faults of an operation algorithm of the wire bonding machine using, for example, the apparatus in FIG. 1;

FIG. 3 is a block diagram illustrating an embodiment of an apparatus configured to detect faults of an operation algorithm of a wire bonding machine, in accordance with aspects of the inventive concept;

FIG. 4 is a perspective view illustrating embodiments of operations for grouping conductive wires using the apparatus in FIG. 3; and FIG. 5 is a flow chart illustrating an embodiment of a method of detecting the faults of the operation algorithms of the wire bonding machine using the apparatus in FIG. 3.

DETAILED DESCRIPTION OF THE EMBODIMENTS

Figure 1:
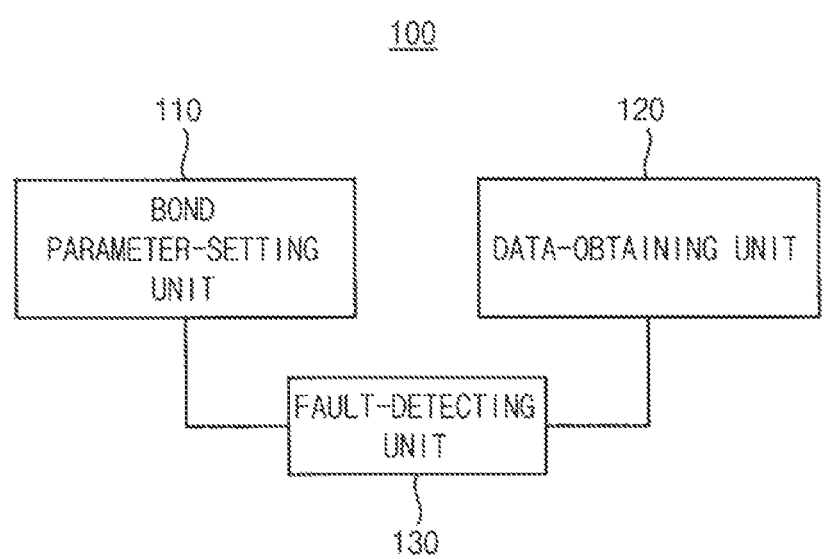

Various aspects of the inventive concept will be described more fully hereinafter with reference to the accompanying drawings, in which some example embodiments are shown. The present invention can, however, be embodied in many different forms and should not be construed as limited to the example embodiments set forth herein. In the drawings, the sizes and relative sizes of layers and regions can be exaggerated for clarity.

It will be understood that when an element or layer is referred to as being "on," "connected to" or "coupled to" another element or layer, it can be directly on, connected or coupled to the other element or layer or intervening elements or layers can be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device can be otherwise oriented (rotated 90 degrees or at other orientations) and the spatially relative descriptors used herein interpreted accordingly.

The terminology used herein is for the purpose of describing particular example embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

When example embodiments are described herein with reference to cross-sectional illustrations, such schematic illustrations are of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions, layers, and the like illustrated herein, but are to also include deviations in shapes that result, for example, from manufacturing. Thus, the regions, layers, and the like illustrated in the figures are schematic in nature and their shapes are not intended to illustrate the actual shape of a region of a device and are not intended to limit the scope of the present invention.

To the extent that functional features, operations, and/or steps are described herein, or otherwise understood to be included within various embodiments of the inventive concept, such functional features, operations, and/or steps can be embodied in functional blocks, units, modules, operations and/or methods. And to the extent that such functional blocks, units, modules, operations and/or methods include computer program code, such computer program code can be stored in a computer readable medium, e.g., such as non-transitory memory and media, that is executable by at least one computer processor.

Hereinafter, example embodiments will be explained in detail with reference to the accompanying drawings.

FIG. 1 is a block diagram illustrating an example embodiment of an apparatus configured to detect faults of operation algorithms of a wire bonding machine, in accordance with aspects of the inventive concepts.

Referring to FIG. 1, an apparatus 100 configured to detect faults of operation algorithms in a wire bonding machine, in accordance with this example embodiment, can include a bond parameter-setting unit 110, a data-obtaining unit 120, and a fault-detecting unit 130. Apparatus 100 can form part of the wire bonding machine.

Figure 4:
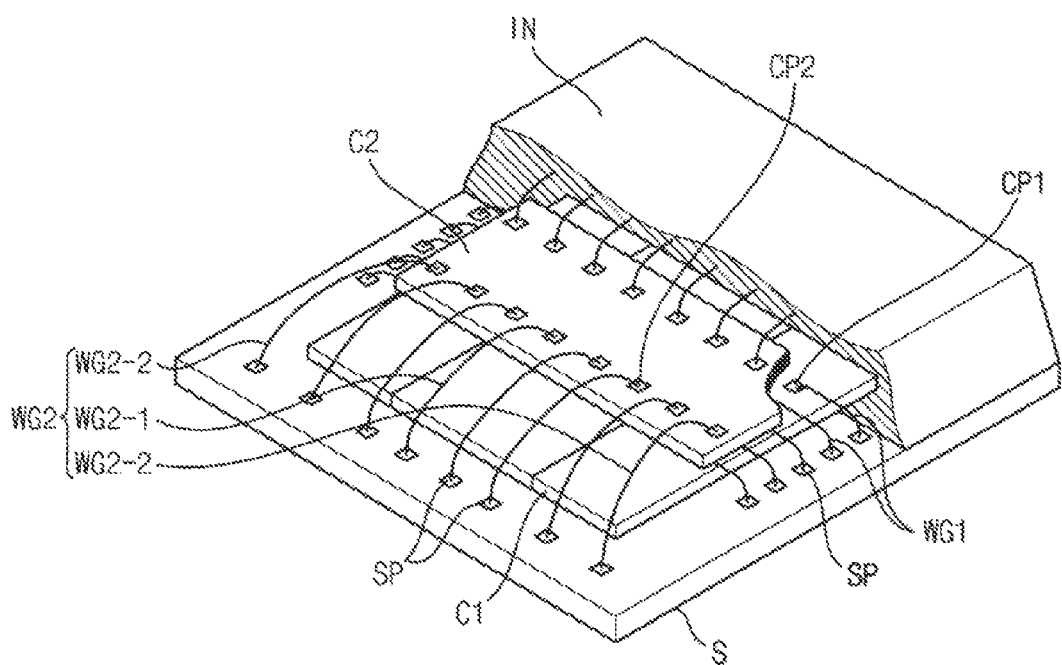

In various embodiments, the wire bonding machine can form conductive wires between semiconductor chips of a multi-chip package (see, for example, FIG. 4). The multi-chip package can include a package substrate, the semiconductor chips, and the conductive wires. The semiconductor chips can be stacked on an upper surface of the package substrate. The conductive wires can be electrically connected between the semiconductor chips, and between any one of the semiconductor chips and the package substrate.

The conductive wires connected between the semiconductor chips can have a length that is different from the lengths of the conductive wires connected between the semiconductor chip and the package substrate. Thus, the wire bonding machine can form the conductive wires between the semiconductor chips in accordance with first operation algorithms. In contrast, the wire bonding machine can form the conductive wires between the semiconductor chip and the package substrate in accordance with second operation algorithms, different from the first operation algorithms. Therefore, the different first and second operation algorithms can be set in the wire bonding machine. The operation algorithms can include a set of bond parameters, such as the length of the conductive wire, a current, a power, a time, and so on, used by the wire bonding machine when forming and installing the conductive wires. As a result of their differences, different conductive wires can have different electrical connecting parameters and functions.

The bond parameter-setting unit 110 can set individual wire bonding parameters with respect to each of the operation algorithms of the wire bonding machine, which can be used to form the conductive wires having the different electrical connecting functions. That is, the bond parameter-setting unit 110 can set individual wire bond parameters for each of the operation algorithms of the wire bonding machine, which can then be used by the wire bonding machine to form different conductive wires.

In example embodiments, when the wire bonding machine is to form the conductive wires connected between the semiconductor chips, a first operation algorithms, including first bond parameters, can be set in the wire bonding machine. Thus, a first set of bond parameter can also be set in the wire bonding machine for forming the conductive wires connected between the semiconductor chips. Similarly, when the wire bonding machine is to form the conductive wires connected between the semiconductor chip and the package substrate, second operation algorithms, including second bond parameters, different from the first operation algorithms, can be set in the wire bonding machine. Thus, a second set of bond parameters, different from the first set of bond parameters, can also be set in the wire bonding machine for forming the conductive wires connected between the semiconductor chip and the package substrate.

In various embodiments, the bond parameter-setting unit 110 can set the individual bond parameters based on design data of the multi-chip package, wherein such design data may be stored in a computer readable medium. When a designer draws or otherwise creates a design drawing of the multi-chip package on a computer, the bond parameter-setting unit 110 can individually set the bond parameters with respect to the operation algorithms of the wire bond machine by electronically processing the design data of the design drawing. The individual bond parameters can be set in accordance with the electrical connecting functions of the conductive wires so that the individual bond parameters can be used as references for detecting faults in the operation algorithms in the wire bonding machine.

The data-obtaining unit 120 can obtain actual data with respect to the operation algorithms of the wire bonding machine that can form actual conductive wires of an actual multi-chip package. In various embodiments, when the design data inputted into the wire bonding machine, for example, through user entry or automated determination from an electronic multi-chip package design, the wire bonding machine can form the actual, physical conductive wires of the actual multi-chip package in accordance with the design data. The data-obtaining unit 120 can electronically obtain the actual data with respect to the operation algorithms of the wire bonding machine that can form the actual conductive wires of the actual multi-chip package. The actual data can correspond to individual data with respect to the operation algorithms of the wire bonding machine that can form the actual conductive wires.

The fault-detecting unit 130 can compare the actual data with the bond parameters to detect faults in the operation algorithms in the wire bonding machine. As mentioned above, because the individual bond parameters can be set in accordance with the different electrical connecting functions of the conductive wires, the fault-detecting unit 130 can accurately detect the faults in the operation algorithms in the wire bonding machine by comparing the actual data with the electronically stored bond parameters.

Figure 2:
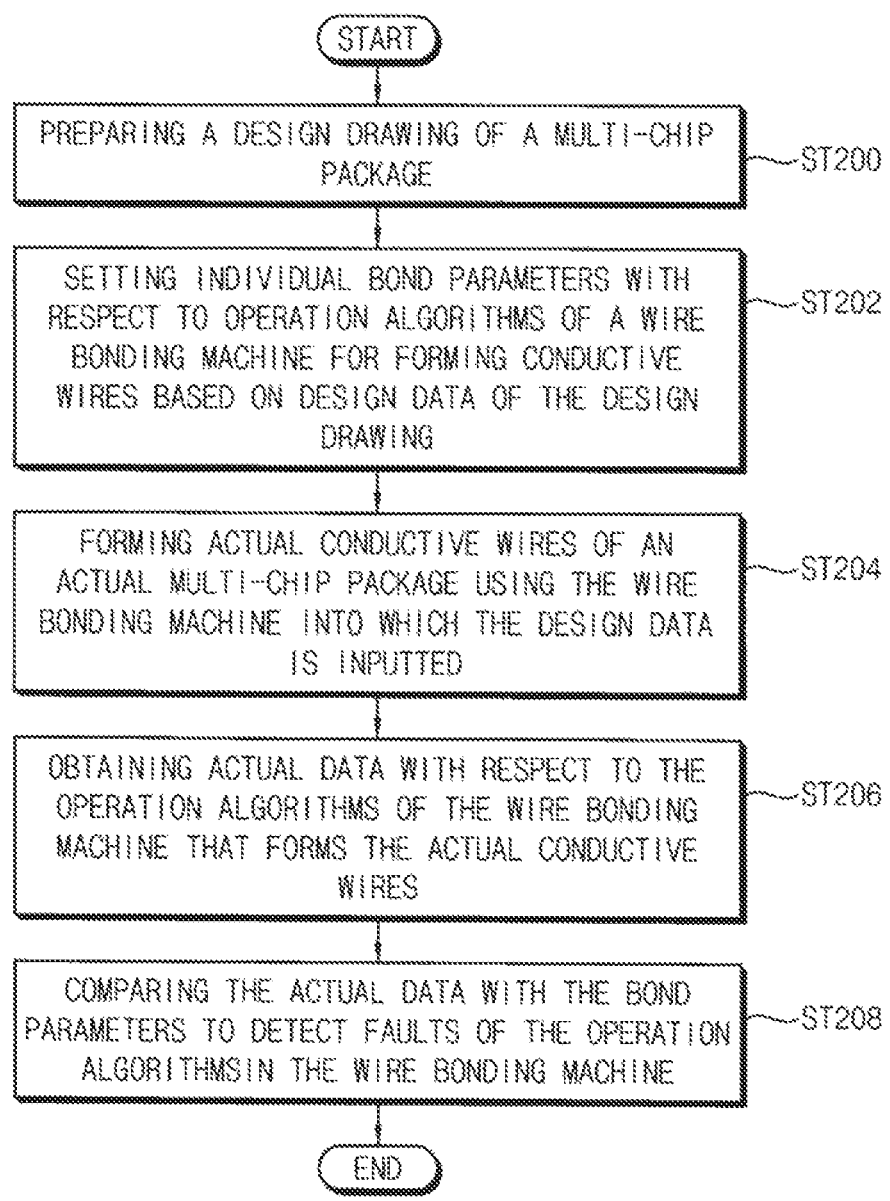

FIG. 2 is a flow chart illustrating an embodiment of a method of detecting faults in the operation algorithms of the wire bonding machine using, for example, the apparatus in FIG. 1.

Referring to FIGS. 1 and 2, in step ST200, the design drawing of the multi-chip package can be prepared. In particular, such preparation can include electronic preparation and storage in the design drawing in a computer readable medium, user input of design drawing information, and combinations thereof. The multi-chip package in the design drawing can include the package substrate, the semiconductor chips and the conductive wires. The semiconductor chips can be stacked on an upper surface of the package substrate. The conductive wires can be electrically connected between the semiconductor chips, and between any one or more of the semiconductor chips and the package substrate. For example, the conductive wires connected between the semiconductor chips can have a length different from that of the conductive wires connected between the semiconductor chip and the package substrate. That is, wire connections between various chips and between various chips and the packages may have different bond parameters, including different lengths. Thus, the wire bonding machine can form different conductive wires according to different operation algorithms. In this example, the conductive wires can be formed between the semiconductor chips in accordance with a first operation algorithm. In contrast, the wire bonding machine can form the conductive wires between the semiconductor chip and the package substrate in accordance with a second operation algorithm, different from the first operation algorithm. Therefore, the different first and second operation algorithms can be set in the wire bonding machine. The operation algorithms can include the length of the conductive wire, a current, a power, a time, and so on, used by the wire bonding machine for forming the conductive wires. As a result, the conductive wires can have different electrical connecting functions.

In step ST202, the bond parameter-setting unit 110 can set the individual bond parameters with respect to each of the operation algorithms of the wire bonding machine, which can form the conductive wires having the different electrical connecting functions, e.g., based on the design data of the design drawing. In various embodiments, the bond parameter-setting unit 110 can individually set the bond parameters with respect to all of the operation algorithms of the wire bonding machine that can form the conductive wires.

In various embodiments, for the wire bonding machine to form the conductive wires connected between the semiconductor chips, the first operation algorithms can be set in the wire bonding machine. Thus, the first bond parameter can also be set in the wire bonding machine for forming the conductive wires connected between the semiconductor chips. Further, for the wire bonding machine to form the conductive wires connected between the semiconductor chip and the package substrate, the second operation algorithm, different from the first operation algorithm, can be set in the wire bonding machine. Thus, a second bond parameter different from the first bond parameter can also be set in the wire bonding machine for forming the conductive wires connected between the semiconductor chip and the package substrate.

In step ST204, the design data can be set in the wire bonding machine. The wire bonding machine can form the actual conductive wires of the actual multi-chip package based on the design data.

In step ST206, the data-obtaining unit 120 can obtain the actual data (of formed conductive wires) with respect to the operation algorithms of the wire bonding machine used to form actual conductive wires of an actual multi-chip package. The actual data can correspond to individual data with respect to the operation algorithms of the wire bonding machine used to form the actual conductive wires.

In step ST208, the fault-detecting unit 130 can compare the actual data with the bond parameters to detect the faults of the operation algorithms in the wire bonding machine. Because the individual bond parameters can be set in accordance with the different electrical connecting functions of the conductive wires, the fault-detecting unit 130 can accurately detect the faults of the operation algorithms in the wire bonding machine by comparing the actual data with the bond parameters, which are each stored in computer readable media.

When the fault-detecting unit 130 detects any one of the operation algorithms in the wire bonding machine to cause a fault, the wire bonding machine can be stopped. Therefore, forming an abnormal conductive wire by the wire bonding machine can be prevented beforehand.

Figure 3:
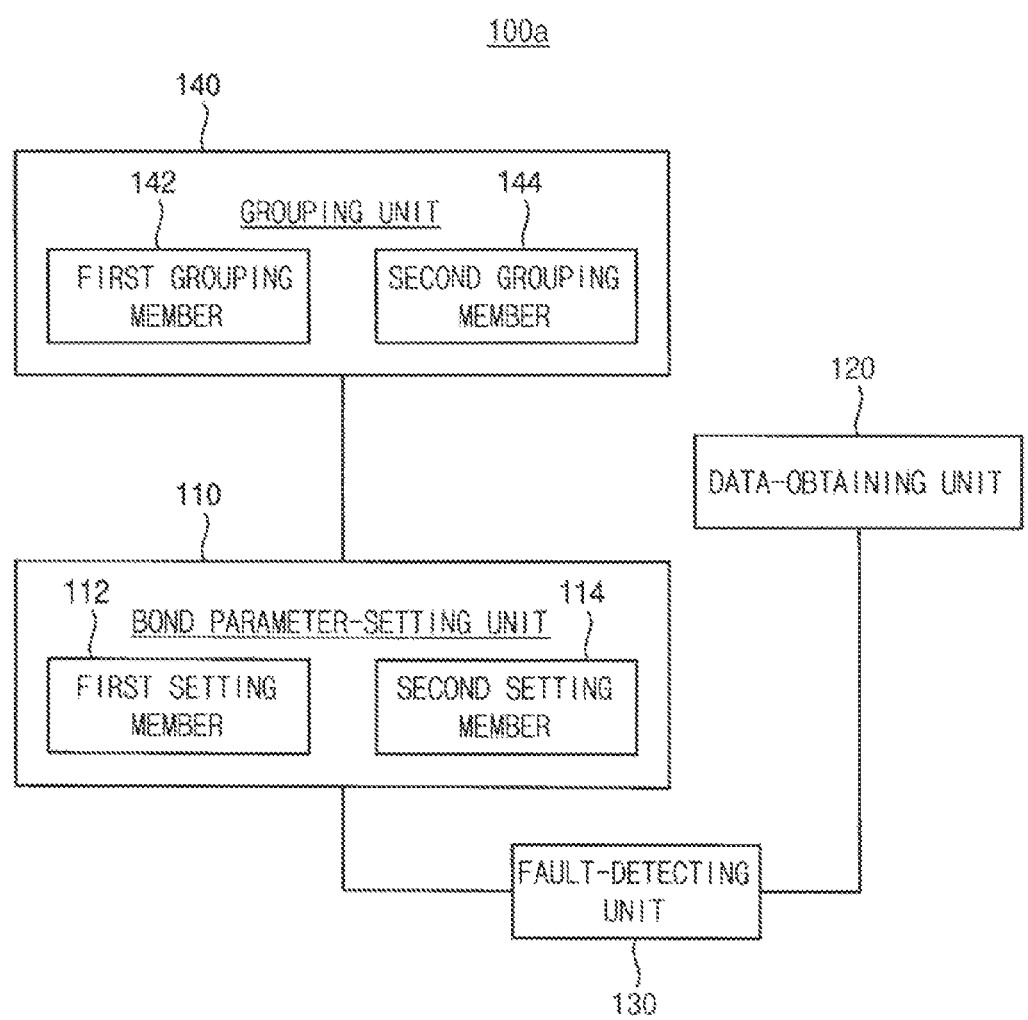

FIG. 3 is a block diagram illustrating an apparatus configured and arranged to detect faults of operation algorithms of a wire bonding machine, in accordance with aspects of the present invention, and FIG. 4 is a perspective view illustrating an embodiment of operations for grouping conductive wires using the apparatus in FIG. 3, as an example.

Referring to FIG. 3, an apparatus 100*a* configured to detect faults of operation algorithms in a wire bonding machine, in accordance with this example embodiment, can include a bond parameter-setting unit 110, a data-obtaining unit 120, a fault-detecting unit 130, and a grouping unit 140.

In example embodiments, referring to FIG. 4, a multi-chip package can include a package substrate S, a first semiconductor chip C1, a second semiconductor chip C2, first conductive wires WG1 and second conductive wires WG2. The first semiconductor chip C1 can be arranged on an upper surface of the package substrate S. The second semiconductor chip C2 can be arranged on an upper surface of the first semiconductor chip C1. The first semiconductor chip C1 and the second semiconductor chip C2 can be crossly stacked. The multi-chip package can include at least one insulating layer IN formed on the substrate S, chips C1 and C2, and wires WG1 and WG2. The insulating layer IN is shown in partial cutaway in FIG. 4.

The first conductive wires WG1 can be electrically connected between the first semiconductor chip C1 and the package substrate S. Chips C1 and C2 can be interconnected via various wiring and/or traces. In this embodiment, the first conductive wires WG1 can connect a first pad CP1 of the first semiconductor chip C1 with a substrate pad SP of the package substrate S. The second conductive wires WG2 can be electrically connected between the second semiconductor chip C2 and the package substrate S. Thus, the second conductive wires WG2 can connect the second pad CP2 of the second semiconductor chip C2 with a substrate pad SP of the package substrate S. The first conductive wires WG1 connected between the first semiconductor chip C1 and the package substrate S can have an electrical connection function different from that of the second conductive wires WG2 connected between the second semiconductor chip C2 and the package substrate S.

The grouping unit 140 can group the first and second conductive wires WG1 and WG2 by substantially the same electrical function. The same electrical function can correspond to a same length of the conductive wires, a same current passing through the conductive wires, a same power applied to the conductive wires, a same time for forming the conductive wires, etc. In example embodiments, the grouping unit 140 can include a first grouping member 142 and a second grouping member 144, as shown in FIG. 3.

The first grouping member 142 can primarily group conductive wires by same input/output signals (I/O) applied to the semiconductor chips. In example embodiments, as shown in FIG. 4, the first conductive wires WG1 can electrically connect the first pad CP1 of the first semiconductor chip C1 with the substrate pad SP of the package substrate S. A first same input/output signal can flow between the first semiconductor chip C1 and the package substrate SP through the first conductive wires WG1. Therefore, the first semiconductor chip C1 and the package substrate can be provided with the first same input/output signal through the first conductive wires WG1.

Further, the second conductive wires WG2 can electrically connect the second pad CP2 of the second semiconductor chip C2 with the substrate pad SP of the package substrate S. A second same input/output signal can flow between the second semiconductor chip C2 and the package substrate S through the second conductive wires WG2. Therefore, the second semiconductor chip C2 and the package substrate S can be provided with the second same input/output signal through the second conductive wires WG2, different from the first same input/output signal through first conductive wires WG1.

The first grouping member 142 can group the first conductive wires WG1 for providing the first semiconductor chip C1 and the package substrate S with the first input/output signal as a first group. The first grouping member 142 can group the second conductive wires WG2 for providing the second semiconductor chip C2 and the package substrate S with the second input/output signal as a second group.

The second grouping member 144 can secondarily group conductive wires in the primarily grouped conductive wires by substantially the same loop path. In example embodiments, as shown in FIG. 4, the second conductive wires WG2 in the second group can include a second central conductive wires WG2-1 arranged at a central portion of the second semiconductor chip C2, and a second edge conductive wires WG2-2 arranged at an edge portion of the second semiconductor chip C2. In order to prevent a contact between the second conductive wires WG2, the substrate pads SP can have a gap or spacing that is wider than that of the second pads CP2. Thus, outermost substrate pads SP among the substrate pads SP can be located protruded from a side surface or corner of the second semiconductor chip C2. Therefore, the second edge conductive wires WG2-2 can have a loop path longer than that of the second central conductive wires WG2-1. That is, the second central conductive wires WG2-1 and the second edge conductive wires WG2-2 can have different loop path lengths.

The second grouping member 144 can group the second central conductive wires WG2-1 having the same loop path as a second-one group. The second grouping member 144 can group the second edge conductive wires WG2-2 having the same loop path as a second-two group. In example embodiments, the second grouping member 144 can secondarily group conductive wires in the set of first conductive wires WG1.

The bond parameter-setting unit 110 can set individual bond parameters with respect to each of the operation algorithms of the wire bonding machine that can form the conductive wires having the different electrical connecting functions. In example embodiments, the bond parameter-setting unit 110 can include a first setting member 112 and a second setting member 114, as in FIG. 3.

The first setting member 112 can set a bond parameter for the primary group with respect to a primary operation algorithm of the wire bonding machine for forming the primarily grouped conductive wires. In example embodiments, the first grouping member 142 can group the first conductive wires WG1 as the first group and the second conductive wires WG2 as the second group. Thus, the first setting member 112 can set a first bond parameter with respect to a first operation algorithm of the wire bonding machine for forming the first conductive wires WG1 in the first group. The first setting member 112 can also set a second bond parameter with respect to a second operation algorithm of the wire bonding machine for forming the second conductive wires WG2 in the second group.

The second setting member 114 can set a bond parameter for the secondary group with respect to a secondary operation algorithm of the wire bonding machine for forming the secondarily grouped conductive wires. In example embodiments, the second grouping member 144 can group the second central conductive wires WG2-1 as the second-one group, and the second edge conductive wires WG2-2 as the second-two group. Thus, the second setting member 114 can set a second-one bond parameter with respect to a second-one operation algorithm of the wire bonding machine for forming the second central conductive wires WG2-1 in the second-one group, and a second-two bond parameter with respect to a second-two operation algorithm of the wire bonding machine for forming the second edge conductive wires WG2-2 in the second-two group.

The data-obtaining unit 120 can obtain actual data with respect to the operation algorithms of the wire bonding machine that can form actual conductive wires of an actual multi-chip package. In example embodiments, when the design data can be inputted into the wire bonding machine, which can be stored in computer memory of the wire boding machine, and the wire bonding machine can form the actual conductive wires of the actual multi-chip package in accordance with the design data. The data-obtaining unit 120 can obtain the actual data with respect to the operation algorithms of the wire bonding machine that can form the actual conductive wires of the actual multi-chip package. The actual data can correspond to individual data with respect to the operation algorithms of the wire bonding machine that can form the actual conductive wires.

The fault-detecting unit 130 can compare the actual data with the bond parameters to detect the faults of the operation algorithms in the wire bonding machine. In example embodiments, the fault-detecting unit 130 can compare actual data with respect to a first operation algorithm of the wire bonding machine for forming the actual first conductive wires in the first group with the first bond parameter(s). The fault-detecting unit 130 can compare actual data with respect to a second-one operation algorithm of the wire bonding machine for forming the actual second central conductive wires in the second-one group with the second-one bond parameter(s). The fault-detecting unit 130 can compare actual data with respect to a second-two operation algorithm of the wire bonding machine for forming the actual second edge conductive wires in the second-two group with the second-two bond parameter(s). Thus, the fault-detecting unit 130 can accurately detect the faults of the operation algorithms in the wire bonding machine by comparing the actual data for the group with respects to the operation algorithms of the wire bonding machine with the bond parameters for the group.

FIG. 5 is a flow chart illustrating en embodiment of a method of detecting faults of the operation algorithms of the wire bonding machine using the apparatus in FIG. 3, as an example.

In example embodiments, referring to FIGS. 3 to 5, in step ST300, a design drawing of the multi-chip package can be prepared. The multi-chip package in the design drawing can include a package substrate S, a first semiconductor chip C1, a second semiconductor chip C2, first conductive wires WG1, and second conductive wires WG2. The first semiconductor chip C1 can be arranged on an upper surface of the package substrate S. The second semiconductor chip C2 can be arranged on an upper surface of the first semiconductor chip C1. The first semiconductor chip C1 and the second semiconductor chip C2 can be stacked crosswise. The first conductive wires WG1 can be electrically connected between the first semiconductor chip C1 and the second semiconductor chip C2, and/or the package substrate S. Thus, the first conductive wires WG1 can connect a first pad CP1 of the first semiconductor chip C1 with substrate pad SP of the substrate. The second conductive wires WG2 can be electrically connected between the second semiconductor chip C2 and the package substrate S. Thus, the second conductive wires WG2 can connect the second pad CP2 of the second semiconductor chip C2 with a substrate pad SP of the package substrate S. The first conductive wires WG1 connected between the first semiconductor chip C1 and the package substrate S can have an electrical connection function different from that of the second conductive wires WG2 connected between the second semiconductor chip C2 and the package substrate S.

In step ST302, the first grouping member 142 can primarily group conductive wires by same input/output signals applied to the semiconductor chips. The first grouping member 142 can group the first conductive wires WG1 for providing the first semiconductor chip C1 and the package substrate with the first input/output signal as a first group. The first grouping member 142 can group the second conductive wires WG2 for providing the second semiconductor chip C2 and the package substrate S with the second input/output signal as a second group.

In step ST304, the second grouping member 144 can secondarily group conductive wires in the primarily grouped conductive wires by substantially the same loop path length. In example embodiments, the second grouping member 144 can group the second central conductive wires WG2-1 having the same loop path length as a second-one group. The second grouping member 144 can group the second edge conductive wires WG2-2 having the same loop path as a second-two group. In example embodiments, the second grouping member 144 can secondarily group conductive wires in the first conductive wires WG1.

In step ST306, the first setting member 112 can set a bond parameter for the primary group with respect to a primary operation algorithm of the wire bonding machine for forming the primarily grouped conductive wires. In example embodiments, the first grouping member 142 can group the first conductive wires WG1 as the first group and the second conductive wires WG2 as the second group. Thus, the first setting member 112 can set a first bond parameter with respect to a first operation algorithm of the wire bonding machine for forming the first conductive wires WG1 in the first group. The first setting member 112 can also set a second bond parameter with respect to a second operation algorithm of the wire bonding machine for forming the second conductive wires WG2 in the second group. In various embodiments, more than one bond parameter could be set for a group.

In step ST308, the second setting member 114 can set a bond parameter for the secondary group with respect to a secondary operation algorithm of the wire bonding machine for forming the secondarily grouped conductive wires. In example embodiments, the second grouping member 144 can group the second central conductive wires WG2-1 as the second-one group, and the second edge conductive wires WG2-2 as the second-two group. Thus, the second setting member 114 can set a second-one bond parameter with respect to a second-one operation algorithm of the wire bonding machine for forming the second central conductive wires WG2-1 in the second-one group, and a second-two bond parameter with respect to a second-two operation algorithm of the wire bonding machine for forming the second edge conductive wires WG2-2 in the second-two group.

In step ST310, the design data can be set in the wire bonding machine. The wire bonding machine can form the actual conductive wires of the actual multi-chip package based on the design data.

In step ST312, the data-obtaining unit 120 can obtain actual data with respect to the operation algorithms of the wire bonding machine that can form actual conductive wires of an actual multi-chip package. The actual data can correspond to individual data with respect to the operation algorithms of the wire bonding machine that can form the actual conductive wires.

In step ST314, the fault-detecting unit 130 can compare the actual data with the bond parameters to detect the faults of the operation algorithms in the wire bonding machine. In example embodiments, the fault-detecting unit 130 can compare actual data with respect to a first operation algorithm of the wire bonding machine for forming the actual first conductive wires in the first group with the first bond parameter(s). The fault-detecting unit 130 can compare actual data with respect to a second-one operation algorithm of the wire bonding machine for forming the actual second central conductive wires in the second-one group with the second-one bond parameter(s). The fault-detecting unit 130 can compare actual data with respect to a second-two operation algorithm of the wire bonding machine for forming the actual second edge conductive wires in the second-two group with the second-two bond parameter(s). Thus, the fault-detecting unit 130 can accurately detect the faults of the operation algorithms in the wire bonding machine by comparing the actual data by the group with respect to the operation algorithms of the wire bonding machine with the bond parameters by the group.

When the fault-detecting unit 130 detects a fault in any one of the operation algorithms in the wire bonding machine, the wire bonding machine can be stopped. Therefore, forming an abnormal conductive wire by the wire bonding machine can be prevented beforehand, e.g., before the multi-chip package is completed.

In example embodiments, the method and the apparatus can be applied to the multi-chip package including the package substrate, the two semiconductor chips and the conductive wires. Alternatively, the method and the apparatus can also be applied to other multi-chip packages including at least three semiconductor chips.

Further, in example embodiments, the method and the apparatus can be applied to the multi-chip package including the semiconductor chips. Alternatively, the method and the apparatus can also be applied to other semiconductor packages including the conductive wires having different electrical connecting functions.

According to example embodiments, the faults of the wire bonding machine for forming the conductive wires having different electrical connecting functions can be accurately detected using the individual bond parameters of the conductive wires. Thus, forming an abnormal conductive wire by the wire bonding machine can be prevented beforehand. As a result, scrapping the semiconductor package can be, for the most part, prevented.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present invention. Accordingly, all such modifications are intended to be included within the scope of the present invention as defined in the claims. In the claims, means-plus-function clauses are intended to cover the structures described herein as performing the recited function and not only structural equivalents, but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of detecting a fault of an operation algorithm in a wire bonding machine for wire bonding multi-chip packages, the method comprising:

setting one or more bond parameters for each of a plurality of operation algorithms of the wire bonding machine, wherein the one or more bond parameters associated with an operation algorithm is based on inputted design data for at least one conductive wire associated with the respective algorithm operation;

forming conductive wires of a semiconductor package using the wire bond machine into which the design data is inputted;

electronically obtaining measurement data, measured related to a formed conductive wire; and electronically comparing the measurement data with a bond parameter associated with an operation algorithm to detect a fault of the associated operation algorithm.

2. The method of claim 1, further comprising grouping conductive wires by electrical connecting functions.

3. The method of claim 2, wherein setting the individual bond parameters comprises setting bond parameters for each grouping of conductive wires with respect to an operation algorithms of the wire bonding machine used to form each grouping of conductive wires.

4. The method of claim 2, wherein grouping the conductive wires by connecting function comprises primarily grouping conductive wires connected between the semiconductor chips by input/output signal provided to the semiconductor chips.

5. The method of claim 4, wherein grouping the conductive wires having the same electrical connecting function further comprises secondarily grouping conductive wires in the primarily grouped conductive wires by loop path length.

6. The method of claim 5, wherein setting the bond parameters comprises:

setting a first bond parameter for the primary group with respect to a first operation algorithm of the wire bonding machine for forming the primarily grouped conductive wires; and setting a second bond parameter for the secondary group with respect to a second operation algorithm of the wire bonding machine for forming the secondarily grouped conductive wires.

7. The method of claim 1, wherein the bond parameters comprise at least one of a current, a power and a time used in the wire bonding machine for forming the conductive wires.

8. An apparatus that detects a fault of an operation algorithm in a wire bonding machine, the apparatus comprising:

a bond parameter-setting unit configured to set one or more bond parameters for each of a plurality of operation algorithms of the wire bonding machine, wherein the one or more bond parameters associated with an operation algorithm is based on design data based on inputted design data for at least one conductive wire between semiconductor chips of a semiconductor package associated with the respective operation algorithm;

a data-obtaining unit configured to obtain measurement data, measured related to a formed conductive wire; and a fault-detecting unit configured to compare the measurement data with a bond parameter associated with an operation algorithm to detect a fault of the associated operation algorithm.

9. The apparatus of claim 8, further comprising a grouping unit configured to group conductive wires by electrical connecting function based on the design data.

10. The apparatus of claim 9, wherein the bond parameter-setting unit is configured to set bond parameters for each grouping of conductive wires with respect to operation algorithms of the wire bonding machine used to form each grouping of conductive wires.

11. The apparatus of claim 9, wherein the grouping unit comprises a first grouping member configured to primarily group conductive wires connected between the semiconductor chips by input/output signal provided to the semiconductor chips.

12. The apparatus of claim 11, wherein the grouping unit further comprises a second grouping member configured to secondarily group conductive wires in the primarily grouped conductive wires by loop path length.

13. The apparatus of claim 12, wherein the bond parameter-setting unit comprises:
- a first setting member configured to set a first bond parameter for the primary group with respect to a first operation algorithm of the wire bonding machine used to form the primarily grouped conductive wires; and
- a second setting member configured to set a second bond parameter for the secondary group with respect to a second operation algorithm of the wire bonding machine used to form the secondarily grouped conductive wires.

14. The apparatus of claim 8, wherein the bond parameters comprise at least one of a current, a power and a time used in the wire bonding machine for forming the conductive wires.

15. A wire bonding system having fault detection, comprising:
- a wire bonding apparatus configured to form and bond wires between one or more chips and a substrate in a semiconductor package according to an inputted design data, wherein the wire bonding apparatus can form different groups of wires in the same package according to different operation algorithms, each group of wires differing from other groups in the value of at least one bonding parameter;
- a bond parameter-setting unit configured to set individual bond parameters with respect to each of the operation algorithms;
- a data-obtaining unit configured to obtain measurement data with respect to the operation algorithms of the wire bonding machine that form the conductive wires; and
- a fault-detecting unit configured to compare the measurement data with the bond parameters to detect a fault of the operation algorithms in the wire bonding machine.

16. The system of claim 15, further comprising a grouping unit configured to group the conductive wires by electrical connecting function based on the design data.

17. The system of claim 16, wherein the bond parameter-setting unit is configured to set bond parameters for each grouping of conductive wires with respect to operation algorithms of the wire bonding machine used to form each groupings of conductive wires.

18. The system of claim 16, wherein the grouping unit comprises:
- a first grouping member configured to primarily group conductive wires connected between the semiconductor chips by input/output signal provided to the semiconductor chips.

19. The system of claim 16, wherein the grouping unit comprises:
- a second grouping member configured to secondarily group conductive wires in the primarily grouped conductive wires by loop path length.

20. The system of claim 15, wherein the bond parameter-setting unit comprises:
- a first setting member configured to set a first bond parameter for the primary group with respect to a first operation algorithm of the wire bonding machine used to form the primarily grouped conductive wires; and
- a second setting member configured to set a second bond parameter for the secondary group with respect to a second operation algorithm of the wire bonding machine used to form the secondarily grouped conductive wires,
wherein the bond parameters comprise at least one of a current, a power and a time used in the wire bonding machine for forming the conductive wires.

* * * * *